(12) United States Patent
De Boeij et al.

(10) Patent No.: US 7,317,512 B2
(45) Date of Patent: Jan. 8, 2008

(54) DIFFERENT POLARIZATION IN CROSS-SECTION OF A RADIATION BEAM IN A LITHOGRAPHIC APPARATUS AND DEVICE MANUFACTURING METHOD

(75) Inventors: Wilhelmus Petrus De Boeij, Veldhoven (NL); Christian Wagner, Eersel (NL)

(73) Assignee: ASML Netherlands B.V., Veldhoven (NL)

(*) Notice: Subject to any disclaimer, the term of this patent is extended or adjusted under 35 U.S.C. 154(b) by 70 days.

(21) Appl. No.: 11/177,482

(22) Filed: Jul. 11, 2005

(65) Prior Publication Data
US 2007/0008511 A1  Jan. 11, 2007

(51) Int. Cl.
*G03B 27/72* (2006.01)
*G03B 27/68* (2006.01)

(52) U.S. Cl. .............................. 355/71; 355/52; 355/67

(58) Field of Classification Search ................ 355/71, 355/67, 53, 52; 359/355
See application file for complete search history.

(56) References Cited

U.S. PATENT DOCUMENTS

| | | | |
|---|---|---|---|
| 6,310,679 B1 * | 10/2001 | Shiraishi | 355/53 |
| 6,392,800 B2 | 5/2002 | Schuster | 359/485 |
| 6,636,295 B2 * | 10/2003 | Shiozawa | 355/67 |
| 6,781,670 B2 * | 8/2004 | Krautschik | 355/53 |
| 2001/0019404 A1 | 9/2001 | Schuster et al. | 355/67 |
| 2005/0094268 A1 * | 5/2005 | Fiolka et al. | 359/499 |

* cited by examiner

*Primary Examiner*—Alan A. Mathews
*Assistant Examiner*—Chia-how Michael Liu
(74) *Attorney, Agent, or Firm*—Pillsbury Winthrop Shaw Pittman LLP

(57) ABSTRACT

A lithographic apparatus comprises an illumination system having optical elements capable of conditioning a radiation beam to comprise in cross-section a first portion of linearly polarized radiation and a second portion of unpolarized or circularly polarized radiation. The apparatus further comprises a support constructed to support a patterning device is provided, the patterning device being capable of imparting the illuminating radiation beam with a pattern in its cross-section to form a patterned radiation beam. A substrate table is provided to hold a substrate, whilst a projection system is provided and configured to project the patterned radiation beam onto a target portion of the substrate.

24 Claims, 27 Drawing Sheets

'Manhattan' lines & spaces multi-pitch, H and V Orientations

Unidirectional lines & spaces multi-pitch

Multi-pitch contact

Degree of Polarization (DOP)
=
percent of power (S) in polarized state $$DOP = \frac{S_{Total.Pol}}{\left(S_{Unpol} + S_{Total.Pol}\right)} \times 100\%$$

$$S = S_{Unpol} + S_{Total.Pol}$$

Polarization Purity (PP)
=
percentage of polarized intensity in desired polarization state.

$$PP = \left\| J_{target} \cdot J_{measured} \right\|^2 \times 100\%$$

J denotes the Jones vector describing the polarised electric field

$$J = \begin{pmatrix} E_s e^{i\phi_s} \\ E_p \end{pmatrix}$$

Figure 9

| Polarization Purity / Degree of Polarization | 100% | 50% | 0% |
|---|---|---|---|
| 100% | ↔ 100%TE, 0%TM IPS = 1 | ⤢ 50%TE, 50%TM IPS = 0.5 | ↕ 0%TE, 100%TM IPS = 0 |
| 50% | ◆+✦ 75%TE, 25%TM IPS = 0.75 | ◆+✦ 50%TE, 50%TM IPS = 0.5 | ◆+✦ 25%TE, 75%TM IPS = 0.25 |
| 0% | ✦ 50%TE, 50%TM IPS = 0.5 | ✦ 50%TE, 50%TM IPS = 0.5 | ✦ 50%TE, 50%TM IPS = 0.5 |

$$IPS = DoP * (PP - 0.5) + 0.5$$

DIFFERENT POLARIZATION IN CROSS-SECTION OF A RADIATION BEAM IN A LITHOGRAPHIC APPARATUS AND DEVICE MANUFACTURING METHOD

1. FIELD OF THE INVENTION

The present invention relates to a lithographic apparatus and a method of using the apparatus in the manufacture of a device such as an integrated circuit (IC). In particular, though not necessarily, the present invention relates to using polarized radiation to maintain and extend the lifetime of an illumination system in a lithographic apparatus whilst still providing radiation optimized to transfer features of a range of spatial dimensions onto a substrate.

2. BACKGROUND TO THE INVENTION

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

U.S. Pat. No. 6,392,800 relates to an optical arrangement wherein an entering beam is converted into an exiting beam having a total cross section of radiation which is linearly polarized essentially in the radial direction by rotation. U.S. Pat. No. 6,392,800 is incorporated herein by reference.

U.S. Pat. App. No. 2001/0019404 relates to a method and arrangement for microlithographic projection exposure at high aperture which achieves a contrast increase by polarization of radiation perpendicular to the plane of incidence on the resist. U.S. Pat. App. No. 2001/0019404 is incorporated herein by reference.

U.S. Pat. No. 6,310,679 describes a lithographic apparatus in which a coherence reducing member is provided in the optical train between the mask and the substrate. The coherence reducing member may be a polarization control member for changing the polarization state of the radiation.

3. SUMMARY OF THE INVENTION

According to a first aspect of the present invention there is provided a lithographic apparatus including an illumination system having optical elements capable of conditioning a radiation beam to comprise in cross-section a first portion of unpolarized or circularly polarized radiation and a second portion of a different polarisation, a support constructed to support a patterning device, the patterning device being capable of imparting the illuminating radiation beam with a pattern in its cross-section to form a patterned radiation beam, a substrate table constructed to hold a substrate and a projection system configured to project the patterned radiation beam onto a target portion of the substrate.

Embodiments of the invention provide a radiation beam for illuminating the patterning device which contains linearly polarized radiation for imaging relatively high resolution features and circularly polarized or unpolarized radiation for imaging relatively low resolution features.

Said second portion of the radiation beam may be linearly polarised, e.g. of a single linear polarisation or of two or more different linear polarisations. Alternatively, said second portion of the radiation beam may contain tangentially (TE) or radially (TM) polarized radiation.

The optical elements may be arranged to produce circularly polarized or unpolarized radiation within a central portion of the radiation beam, and linearly polarized radiation within an outer portion of the radiation beam. Said first portion may be an inner circular portion, and said second portion may be a ring around the first portion, or vice versa.

Said optical elements may comprise an optical element located substantially at a pupil plane of the illuminating system, e.g. in the adjustor, integrator or condenser, for producing said circularly polarized or unpolarized radiation. This optical element may be a λ/4 plate for producing circular polarization; a pair of adjacent wedges of different material, a first of the wedges being formed of an optically active material, and the second being formed of an optically inactive material, e.g. fused silica, arranged to transform a portion of the radiation beam into unpolarized radiation; or a diffractive optical element comprising multiple portions each creating a different polarization.

The optical element arranged to produce circularly polarized or unpolarized radiation may be combined with a further optical element arranged to provide linear polarization of said first portion of the radiation beam. Said further optical component may be a λ/2 plate.

According to a second aspect of the present invention, there is provided a lithographic apparatus comprising:

an illumination system comprising a first optical element being arranged to condition a radiation beam so as to comprise substantially only linearly polarized radiation polarized in a first direction and/or linearly polarized radiation polarized in a second direction perpendicular to said first direction, one or more second optical elements subject to developing birefringence having an optical axis in said first direction and through which the linearly polarized radiation is transmitted, and a third optical element for subsequently transforming at least a part of the linearly polarized radiation into unpolarized or circularly polarized radiation;

a support constructed to support a patterning device, the patterning device being capable of imparting the illuminating radiation beam with a pattern in its cross-section to form a patterned radiation beam;

a substrate table constructed to hold a substrate; and a projection system configured to project the patterned radiation beam onto a target portion of the substrate.

It is found that linearly polarizing the radiation beam in a manner according to the present invention maintains and extends the lifetime of an illumination system. Transforming at least a part of the linearly polarized radiation into unpolarized or circularly polarized radiation ensures that the radiation which illuminates the patterning device is optimised for transferring features of various dimensions from the patterning device to the substrate.

The third optical element may be located substantially at a pupil plane of the illuminating system, e.g. in the adjustor, integrator or condensor.

The third optical element may be arranged to produce circularly polarized or unpolarized radiation within one portion of the radiation beam, and linearly polarized radiation within another portion of the radiation beam.

The third optical element may be arranged to transform only a central portion of the radiation beam into unpolarized or circularly polarized radiation, leaving an outer ring of linearly polarized radiation.

The third optical element may be a λ/4 plate for transforming a part of the radiation beam into circularly polarized radiation.

The third optical element may comprise a pair of adjacent wedges of material, a first of the wedges being formed of an optically active material, and the second being formed of an optically inactive material, e.g. fused silica, arranged to transform a portion of the radiation beam into unpolarized radiation.

A polarized beam in the present invention having first and second directions substantially perpendicular to one another, is sometimes generally referred to as XY polarized radiation. Reference to XY polarized radiation hereinafter is therefore meant to mean radiation with a first and second polarization, said second polarization being substantially perpendicular to the first.

Typically, any suitable illumination mode may be used in the illumination system. The illumination modes may have multipole illumination. Typically, the poles in the multipole illumination may be chosen to maximize the amount of diffracted radiation within a pupil, whereas the choice of having either X or Y polarized radiation per pole may maximize the content of TE (i.e. transverse electric) polarization, thus maximizing the contrast.

The illumination mode may be any segmented point-symmetric illumination mode or non-symmetric illumination mode. For example, illumination modes include any of the following: conventional, dipole, a-symmetric, quadru-pole, hexa-pole (i.e. six poles) and annular.

Typically, substantially all of the linearly polarized fraction of the radiation beam is polarized into either the first or second direction modes of polarization by the first optical element. The remaining (not linearly polarized) radiation can be unpolarized or circularly polarized. Preferably, at least 95% of the polarized radiation beam is polarized in either the first or second direction. The ratio between the radiation polarized in the first and second direction may depend on polarization properties of the optical device. In general, about 50% of the radiation may be polarized in the first direction and about 50% in the second direction. Alternatively, either the polarization in the first or second directions may dominate.

Typically, the first optical element may comprise a set of optically active plates or birefringent plates such as two half-wavelength plates.

The half-wavelength plates may be any suitable shape and may preferably be substantially triangular in shape. The half-wavelength plates may be in any of the condensor (CO), adjustor (AD) or integrator (IN). Typically, the half-wavelength plates may be both in the condensor (CO), adjustor (AD) or integrator (IN). The half-wavelength plates may be in or near the pupil plane of any of the condensor (CO), adjustor (AD) or integrator (IN). Alternatively, there may be one half-wavelength plate in any of the condensor (CO), the adjustor (AD) or the integrator (IN).

The half-wavelength plates may be formed from quartz silica or any other material with intrinsic or externally induced birefringence optical properties at the actinic wavelength. The half-wavelength plates may be oriented such that they impose the desired optical polarization rotation onto incident radiation. The rotation of polarization orientation can be based on the physical principles of linear birefringence (half-wavelength plates) or circular birefringence (optical rotary activity).

Linearly birefringent uniaxial crystalline materials are characterized by having a unique axis of symmetry, called the optical axis, which imposes constraints upon the propagation of radiation beams within the crystal. Two modes are permitted, either as an ordinary beam polarized in a plane normal to the optic axis, or as an extraordinary beam polarized in a plane containing the optical axis. Each of the beams has an associated refractive index, such that both the electric field (wave normal) velocities and the beam (ray) angles of refraction are different. It is this latter property that enables suitably cut and oriented prisms of birefringent of birefringent materials to act as retarders, rotators, polarizers and polarizing beam splitters.

If a plane polarized beam propagates down the optical axis of a material exhibiting circular birefringence it is resolved into two collinear circularly polarized beams, each propagating with a radiationally different velocity. When these two components emerge from the material, they recombine into a plane polarized beam whose plane of polarization is rotated from that of the incident beam. This effect of producing a progressive rotation of the plane of polarization with path length is called optical activity, and is used to produce optical rotators.

Typically, imaging properties which may be improved include any of the following: an enhancement in the image contrast, an increment improvement of the exposure latitude, lower Mask Error Enhancement Factors (MEEF) and a reduced line-edge roughness.

The lifetime of the illumination system may be extended up to about $30 \times 10^9$ shots (i.e. 30 G shots), about $35 \times 10^9$ shots (i.e. 35 G shots), about $40 \times 10^9$ shots (i.e. 40 G shots) or up to about $110 \times 10^9$ shots (i.e. 110 G shots). Using 45° polarization (i.e. there are two polarizations at 45° to each other) the lifetime of the illuminator may be less than $20 \times 10^9$ shots (i.e. 20 G shots). Preferably, the lifetime of the illumination system may be essentially infinite. Therefore, after a certain number of shots, material forming the illumination system may effectively saturate at a very low induced birefringence.

The lithographic apparatus may comprise a numerical aperture (NA) greater than about 1.0.

Typically, at least part of the lithographic apparatus may be immersed in an immersion fluid such as water.

According to a further aspect of the present invention, there is provided a device manufacturing method comprising:

providing a substrate;

providing a conditioned radiation beam using an illumination system;

imparting a pattern to the radiation; and projecting the patterned beam of radiation onto a target portion of the substrate;

wherein the step of providing the conditioned radiation beam comprises conditioning a radiation beam to comprise in cross-section a first portion of unpolarized or circularly polarized radiation and a second portion of a different polarisation.

According to a still further aspect of the present invention there is provided a device manufacturing method comprising the steps of:

providing a substrate;

providing a conditioned radiation beam using an illumination system;

imparting a pattern to the radiation; and projecting the patterned beam of radiation onto a target portion of the substrate;

wherein the step of providing the conditioned radiation beam comprises conditioning a radiation beam so as to comprise substantially only linearly polarized radiation polarized in a first direction and/or linearly polarized radiation polarized in a second direction perpendicular to said first direction, transmitting the radiation through an optical element subject to developing birefringence having an optical axis in said first direction, and subsequently transforming at least a part of the linearly polarized radiation into unpolarized or circularly polarized radiation.

According to a further aspect of the present invention there is provided a device manufactured according to the method of one of the above aspects of the invention. The manufactured device may be, for example, an integrated circuit (IC), integrated optical system, a guidance and detection patterns for a magnetic domain memory, a liquid crystal display (LCD), or a thin-film magnetic head.

4. BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 9 depicts a table representing degree of polarization (DOP) and polarization purity combining both into the intensity in the preferred polarized state (IPS) wherein the IPS measures the intensity of the chosen polarization direction;

Figure 24:
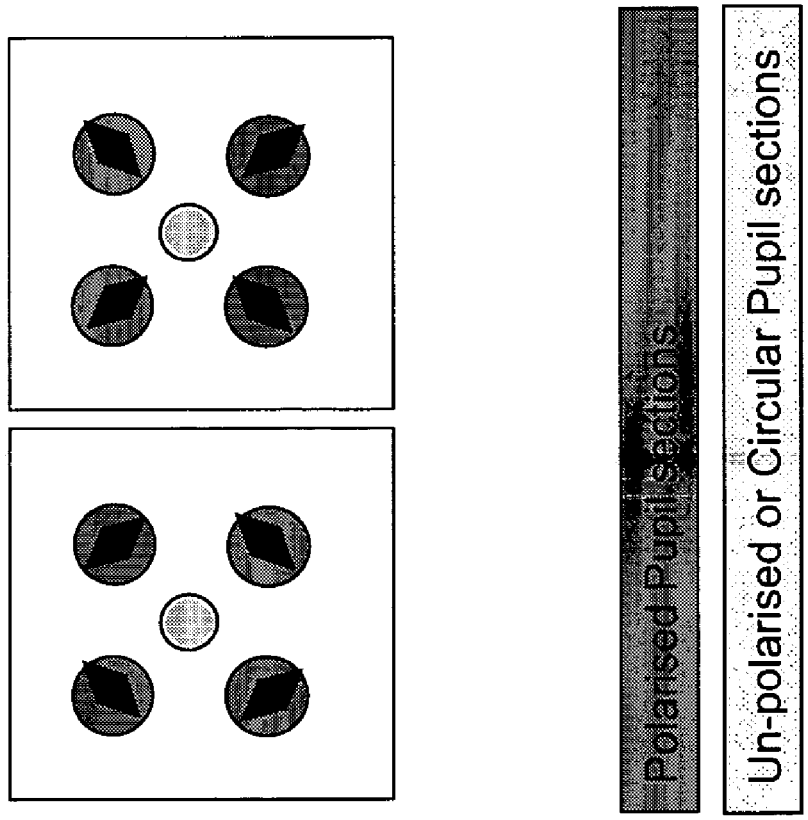
Figure 25:
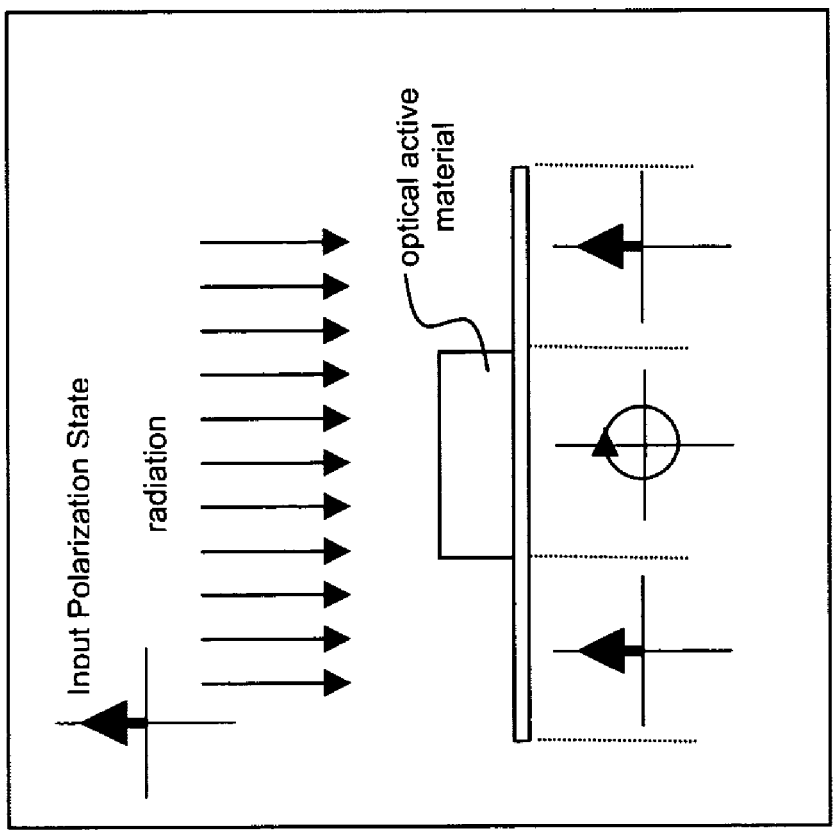
Figure 25:
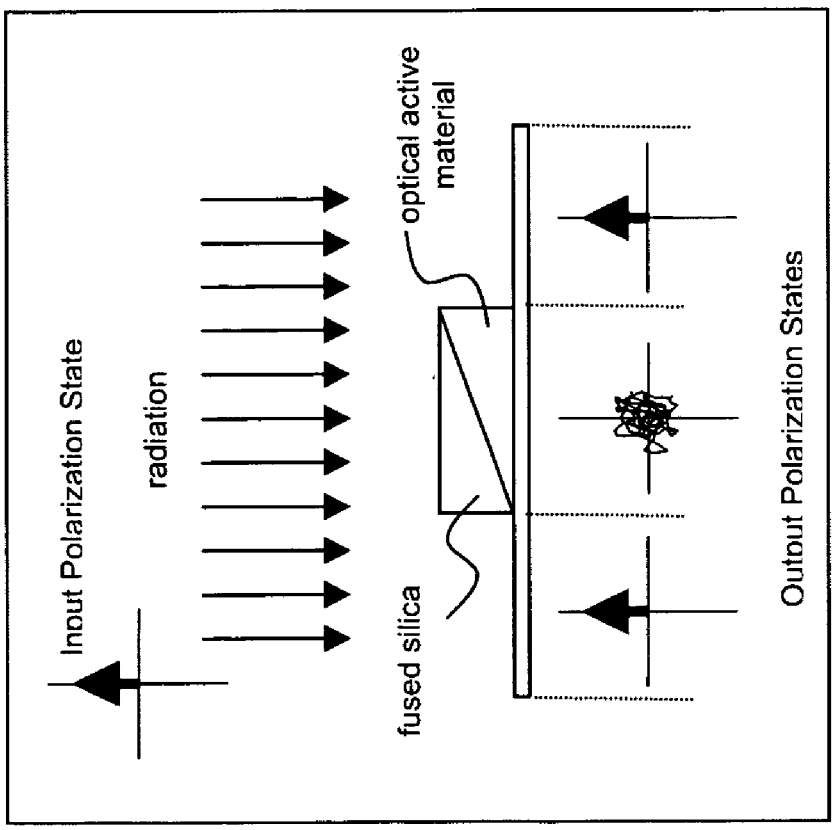

FIG. 24 illustrates several soft-quasar illumination modes with linearly or tangential (TE) or radial (TM) polarized portions and unpolarized or circularly polarized portions; and FIG. 25 illustrates the resulting polarization of a radiation beam following transmission through a wedged Hanle depolarizer (left panel) and a λ/4 plate (right panel) both illuminated by a linearly polarized radiation beam.

5. DETAILED DESCRIPTION

Figure 1:
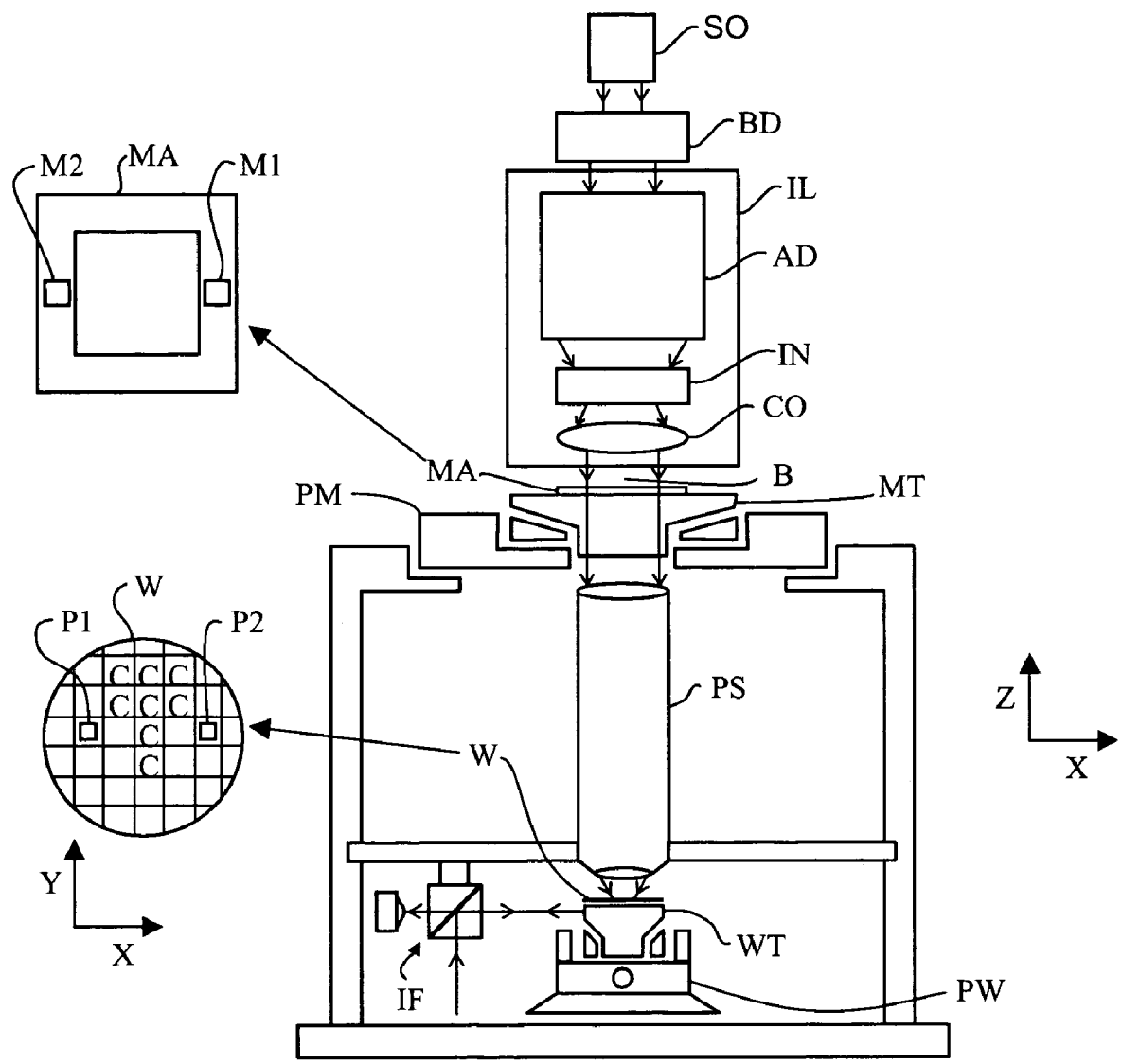
FIG. 1 depicts a lithographic apparatus according to an embodiment of the invention.

FIG. 1 schematically depicts a lithographic apparatus comprising:

an illumination system (illuminator) IL configured to condition a radiation beam B (e.g. UV radiation or DUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

A conventional approach to lithography has been to use polarized radiation due to the enhancement of image contrast that this provides. An incremental improvement in Exposure Latitude (EL), lower Mask Error Enhancement Factors (MEEF) and reduced line-edge roughness may also be obtained by using polarized radiation. The advantages of using polarized radiation are directly coupled to the scattering direction of a structure's diffraction orders. In general, diffraction orders parallel to a dense pitch structure on the reticle will benefit the image contrast when they are polarized. In the case of complicated reticle patterns including for example multiple pitches and 2D (e.g. X and Y) orientations, and in order to minimize end-of-line or end-of-array ringing effects, diffraction modes under other directions need however to be considered. For these diffraction modes the linearly polarized illumination modes are very often far from optimal and secondary illumination modes can be added with other polarization states to enhance image contrast at specific structure locations. The polarization states of the additional illumination modes can be unpolarized or circularly polarized.

Figure 2:
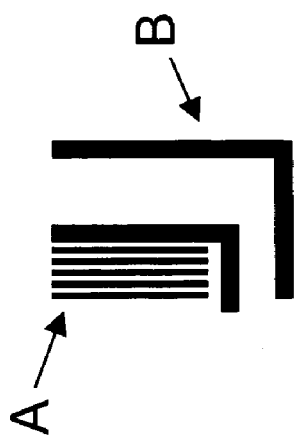
FIG. 2 illustrates several structures to be imaged onto a substrate using a lithographic apparatus.
Figure 2:
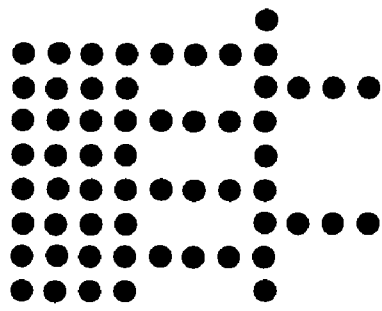

Consider for example FIG. 2 which illustrates some structures that might be used in integrated circuit devices. Some structures comprises a set of densely packed lines (A) having a high spatial frequency and (semi-) isolated lines (B) having a low spatial frequency. Some lines will be present having orientations different that the main feature (e.g. dense vertical lines and additional horizontal semi-isolated features). For the contacts layer of a device, multiple pitches will be present (dense, semi-isolated and some fully isolated contacts). Note that any structure will have a finite dimension so specific end-of-line & end-of-array effects need to be anticipated. Structures of the type illustrated in FIG. 2 are best imaged using a combination of linearly and circularly or unpolarized radiation.

A problem which exists in the art is that due to polarization induced compaction, birefringence is burnt into fused silica material forming part of an illumination system. It has been found that if the polarization orientation of the radiation beam impinging on these components is not parallel or orthogonal to the birefringence orientation, the polarization orientation is changed, thus leading to critical dimension (CD) errors. In practice, this effect severely restricts the life of the illuminating system. By forming linearly polarized radiation, oriented in the direction of the birefringence and/or perpendicular thereto, this problem can be mitigated and the life of the apparatus increased. Such polarized radiation may be generally referred to as XY polarized radiation.

Figure 3:
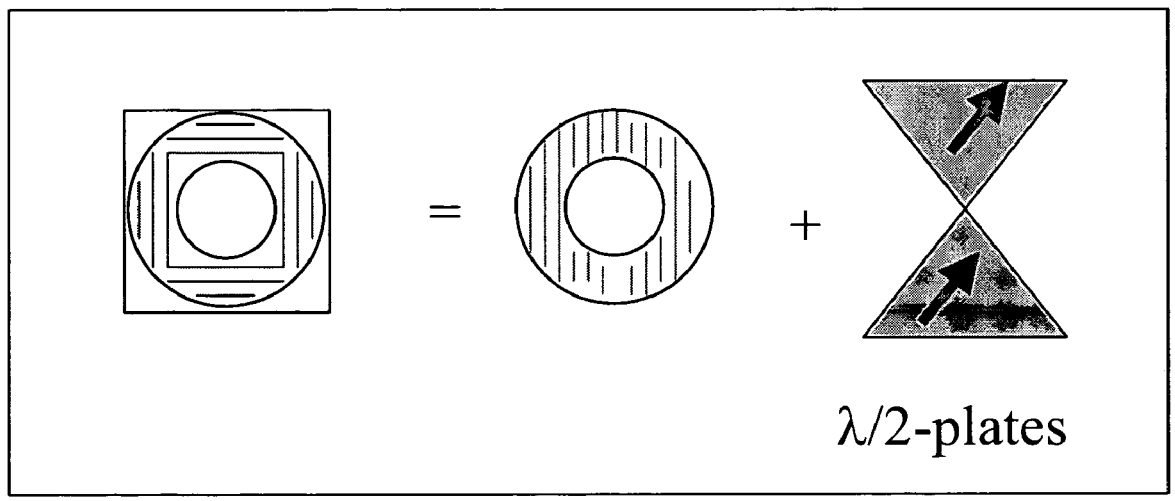
FIG. 3 depicts the conversion of linear polarization in an annular illumination mode with two half-wavelength plates into polarized radiation in a first and second direction substantially perpendicular to one another according to an embodiment of the invention.

As shown in FIG. 3, annular illumination with radiation linearly polarized in a first and second direction is formed, said first and second directions being substantially perpendicular to each other. The ratio between the first and second directions of polarized radiation is 1:1. At least 95% of the radiation is polarized in either the first and second directions.

Figure 4A:
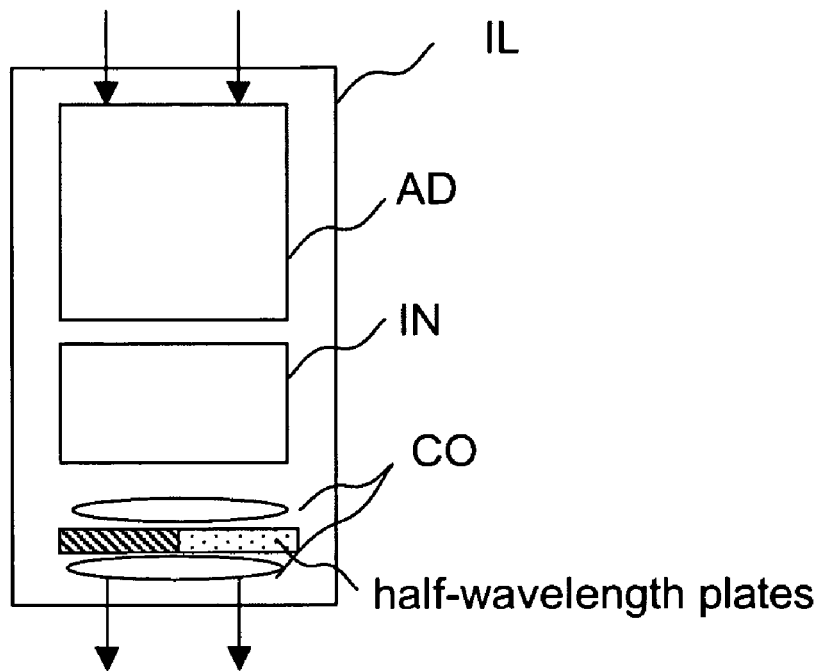
FIGS. 4a-4c depict the arrangement of two half-wavelength plates in apparatus according to embodiments of the invention.
Figure 4B:
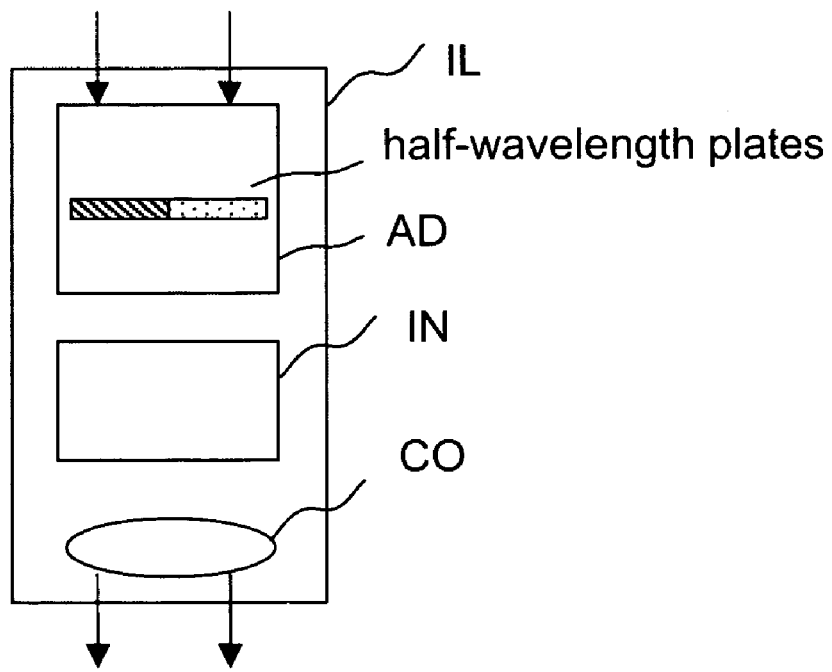
Figure 4C:
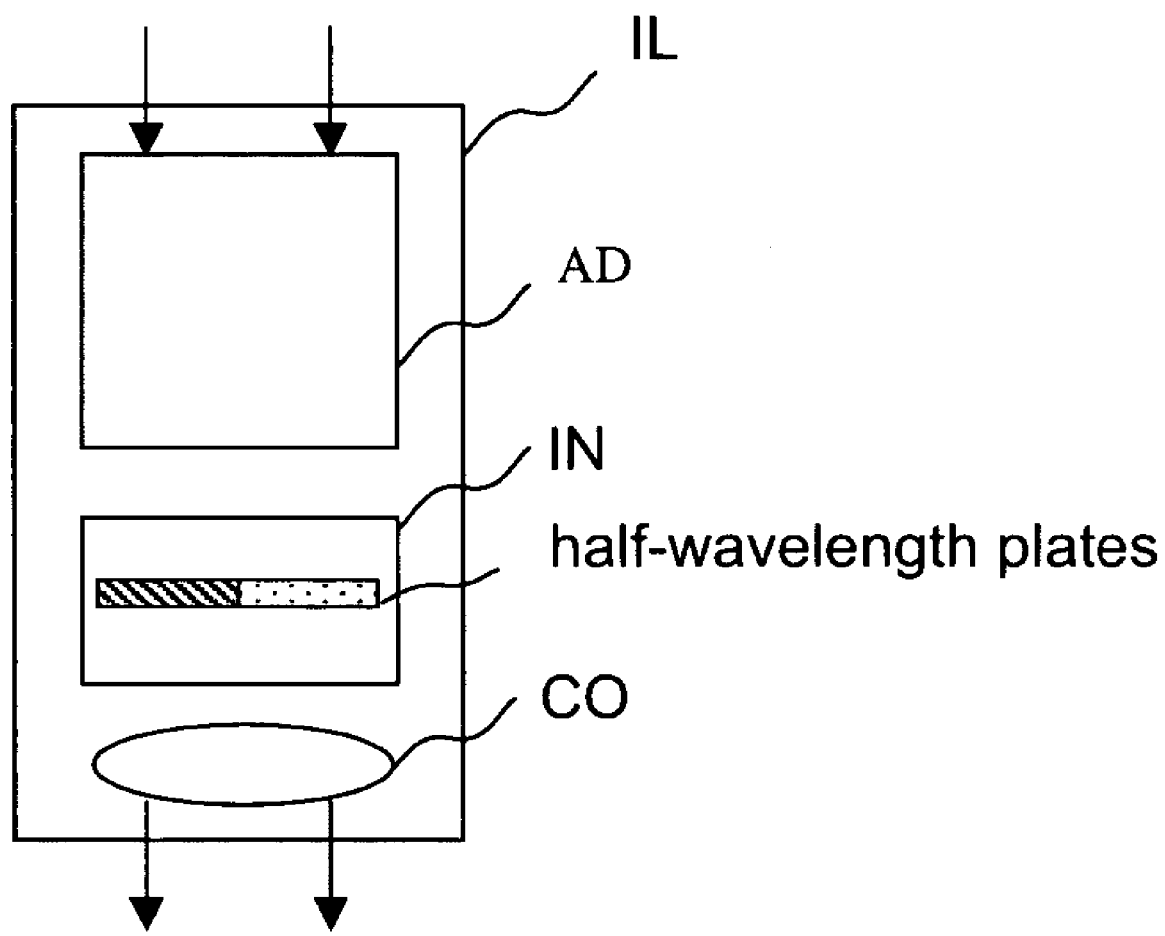

FIG. 4*a* depicts two half-wavelength plates (i.e. identified as the rotator) in the condensor (CO) of apparatus according to the present invention. FIG. 4*b* depicts the two half-wavelength plates (i.e. the rotator) in the adjuster (AD). FIG. 4*c* depicts the two half-wavelength plates in the integrator (IN).

Figure 5:
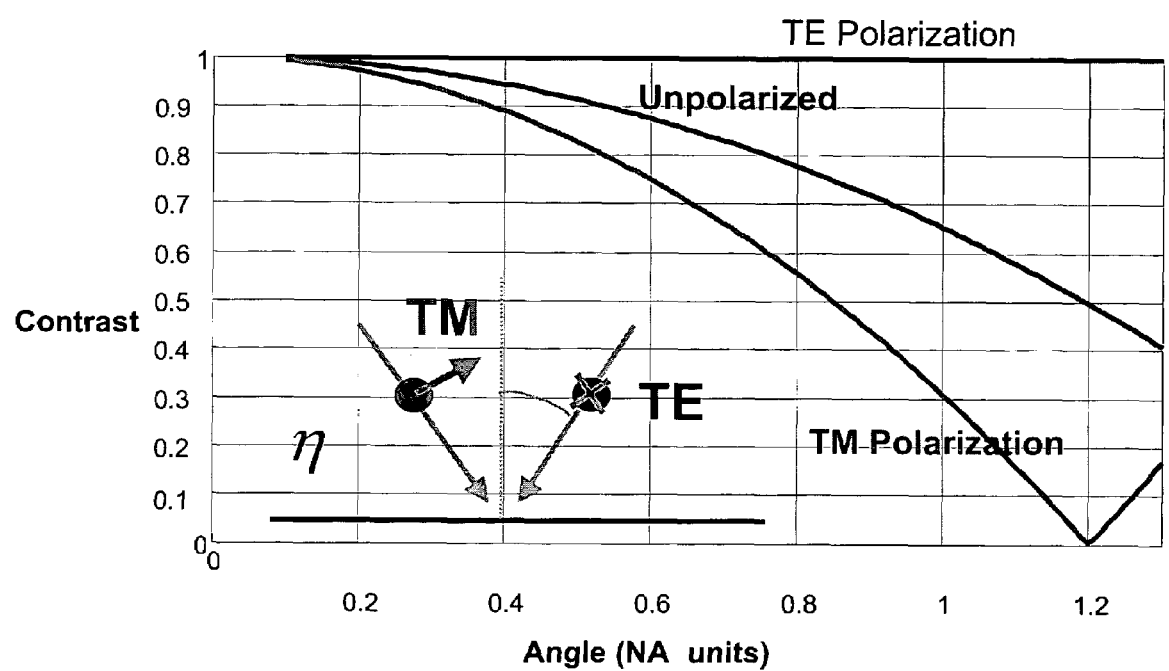
FIG. 5 depicts the benefits of polarization which shows that image contrast is increased by maximizing the fraction of TE polarized radiation according to an embodiment of the invention.

FIG. 5 depicts the benefits of polarization which shows that having a high numerical aperture (NA) has significant imaging polarization effects. FIG. 5 shows that for TE (transverse electric) polarization the image contrast does not decrease with increasing numerical aperture (NA). However, FIG. 5 shows that for unpolarized and TM (transverse magnetic) polarization, there is a reduction in the image contrast with increasing numerical aperture (NA). FIG. 5 therefore shows that there may be an improvement in the image contrast and mask error factor (MEF) improvements when using TE polarization.

Figure 6:
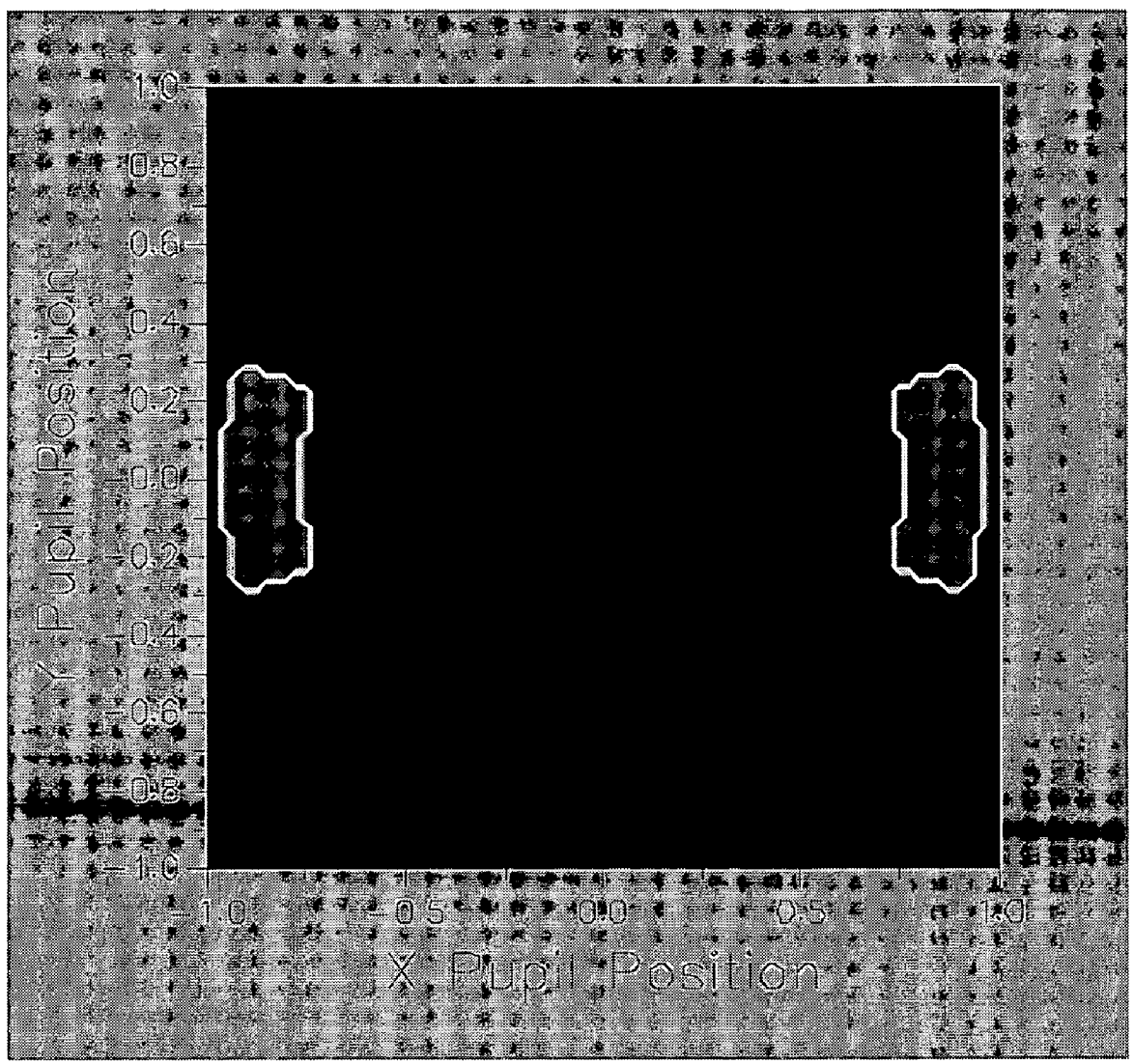
FIG. 6 depicts an image of the polarized radiation in a dipole illumination according to an embodiment of the invention.

FIG. 6 represents a pupil image for a dipole illumination mode according to an embodiment of the present invention using an attenuated phase shift mask (att-PSM).

Figure 7:
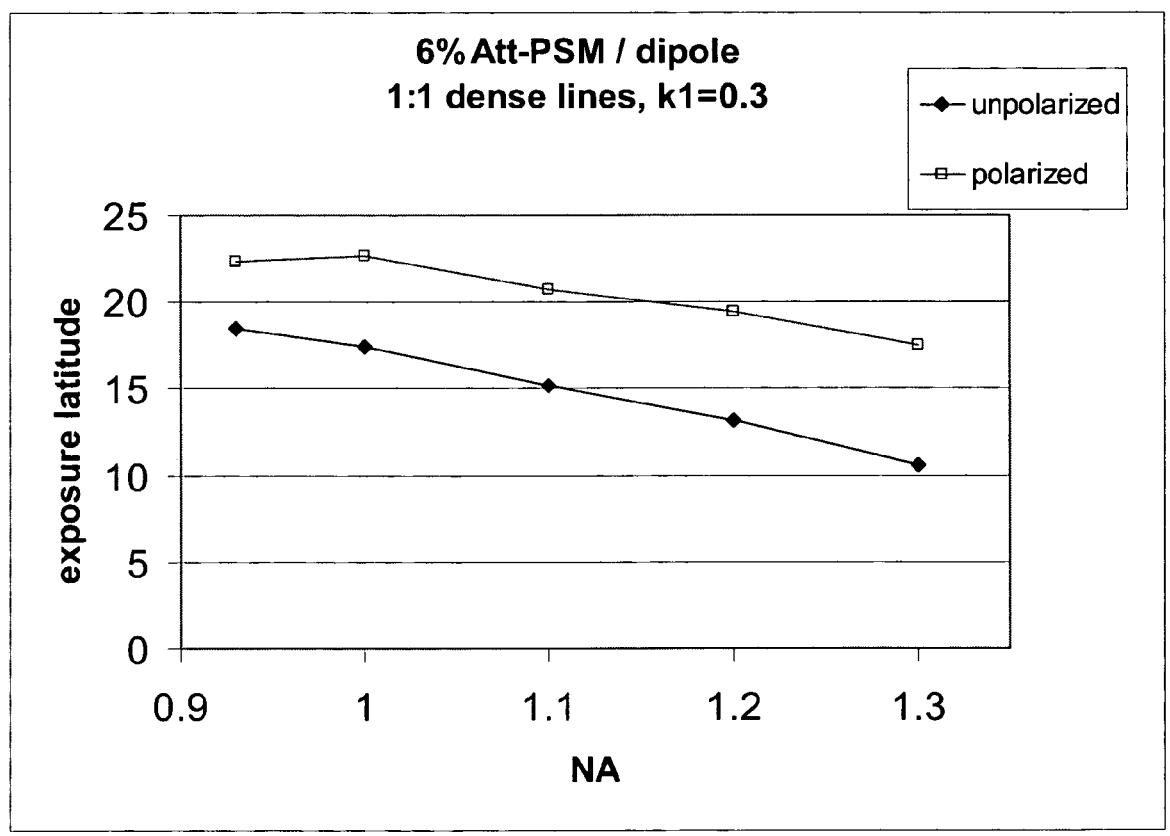
FIG. 7 depicts exposure latitude (EL) versus numerical aperture (NA) for an attenuated phase shift mask for unpolarized and polarized radiation wherein for both polarized and unpolarized radiation the dipole illumination of FIG. 5 is used, the polarization direction chosen to be parallel to the Y direction of the Figure.

FIG. 7 shows that the exposure latitude (EL) is higher for polarized radiation in comparison to unpolarized radiation. For both the polarized and unpolarized radiation the dipole of FIG. 6 is used, the polarization direction being chosen to be parallel to the Y direction of the Figure.

Figure 8A:
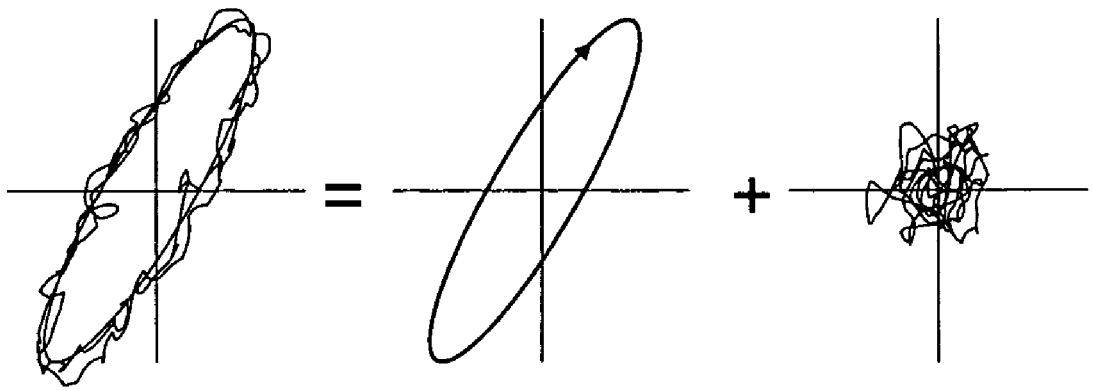
FIGS. 8a and 8b depict diagrams representing degree of polarization (DoP) and polarization purity (PP)
Figure 8B:
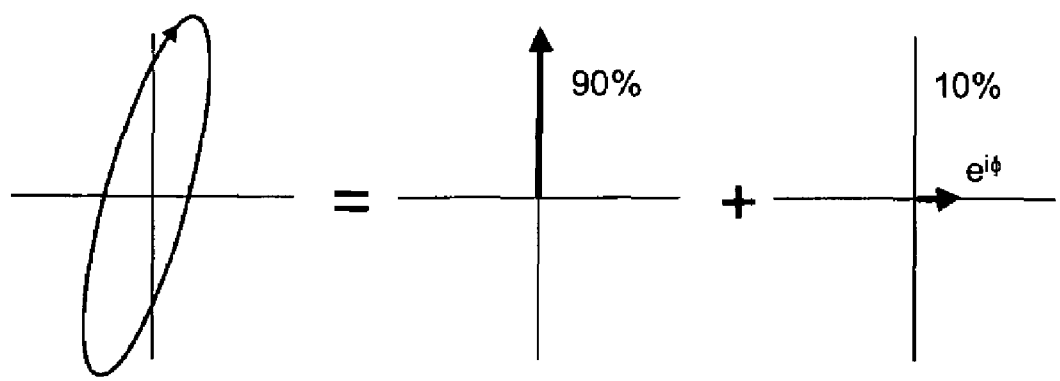

FIGS. 8*a* and 8*b* are general representations which illustrate the description of polarized radiation. The quality of polarized radiation can be defined using two values. Firstly, the degree of polarization (DOP) may be used to quantify the polarized radiation which describes the fraction of radiation which is polarized. Secondly, polarization purity (PP) which relates to the fraction of the polarized radiation in the correct direction may also be used.

FIG. 9 represents a table for different polarization situations with different degrees of polarization and polarization purity (PP). In the table, the degree of polarization (DoP) and polarization purity (PP) are combined to form an intensity in the preferred polarized states (IPS). The IPS measures the intensity of the chosen polarization direction.

Figure 10:
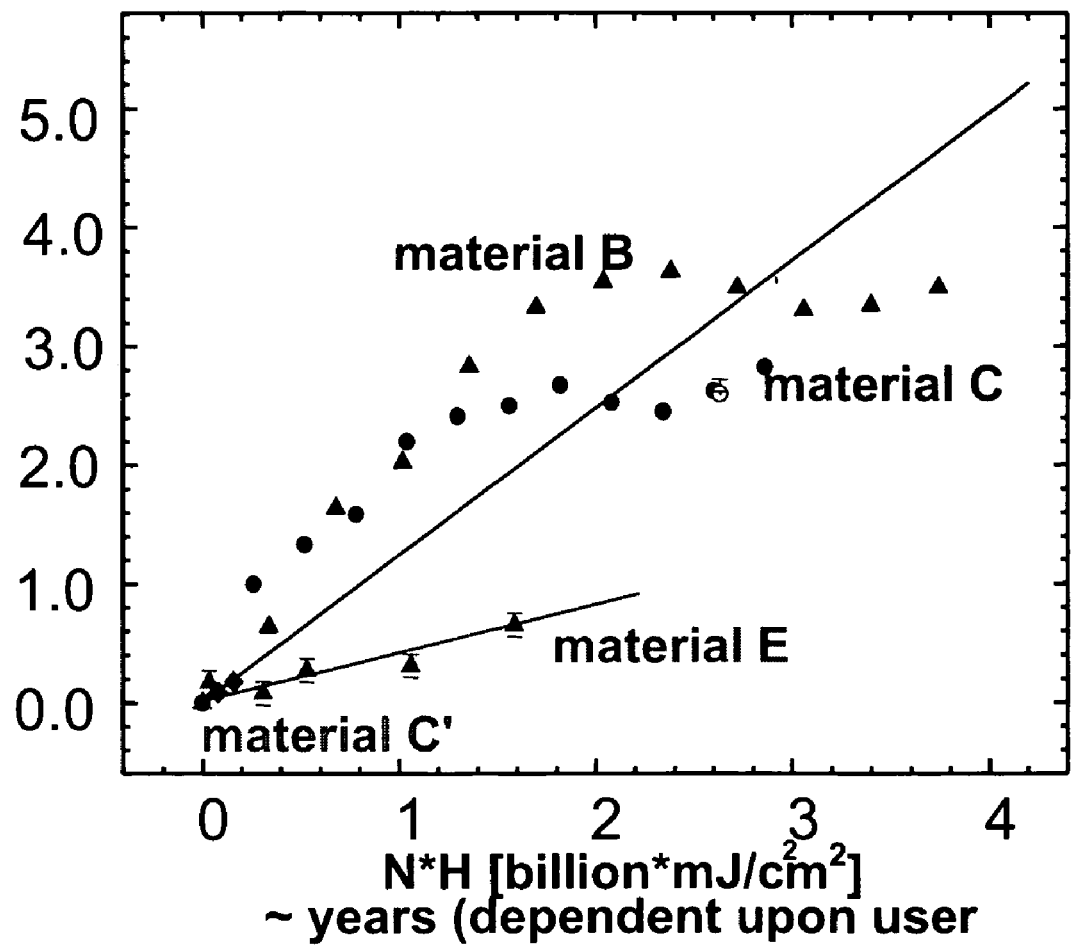
FIG. 10 depicts a graph of birefringence versus lifetime for different illuminator materials according to an embodiment of the invention.

FIG. 10 depicts a graph of birefringence versus lifetime in years for different illuminator materials using polarized irradiation. It shows fused silica degradation (i.e. birefringence burn in) as a function of different material grades.

Figure 11:
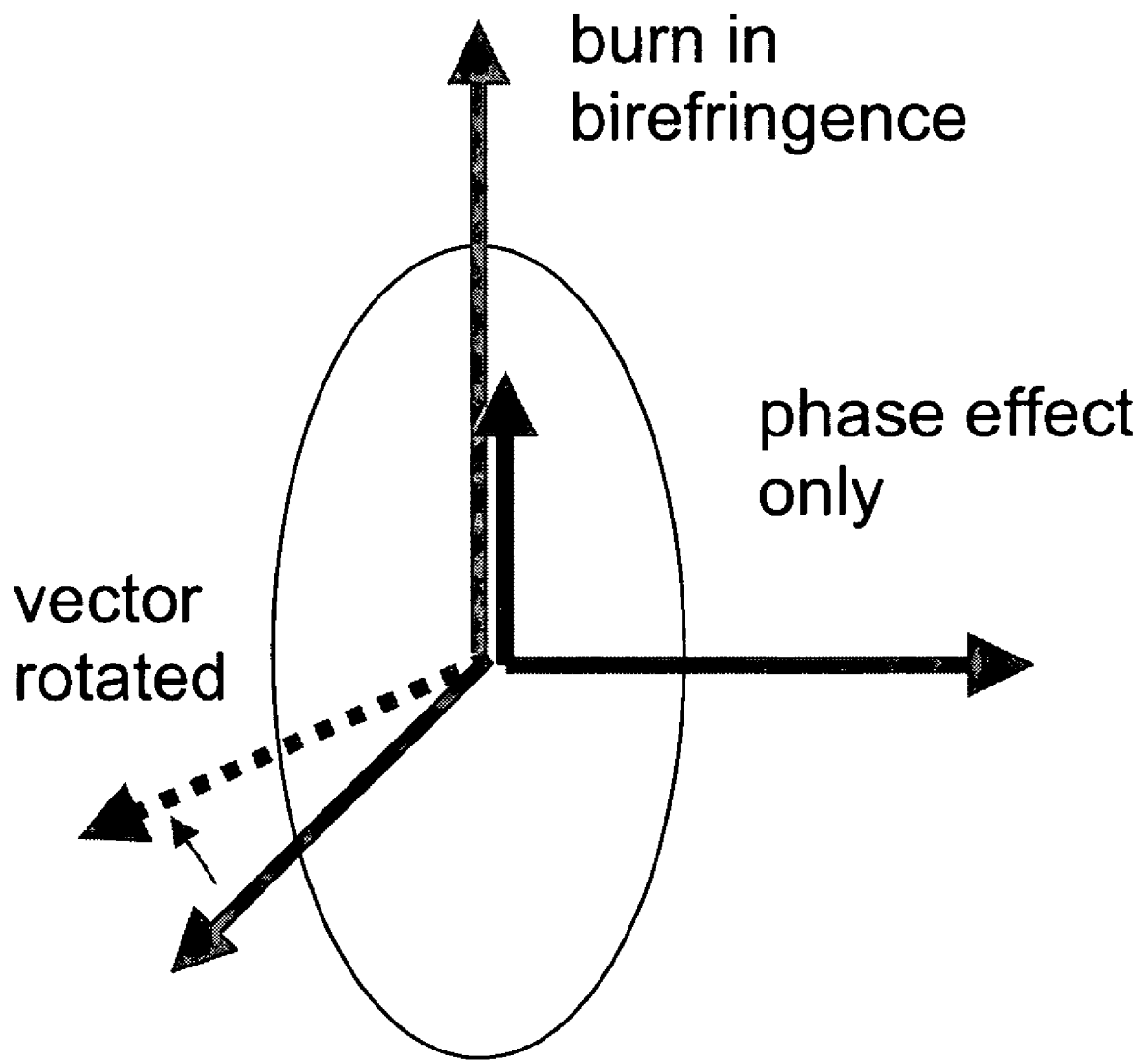
FIG. 11 depicts burn in birefringence with x-polarized radiation.

FIG. 11 depicts the burn in birefringence with x-polarized radiation.

Figure 12:
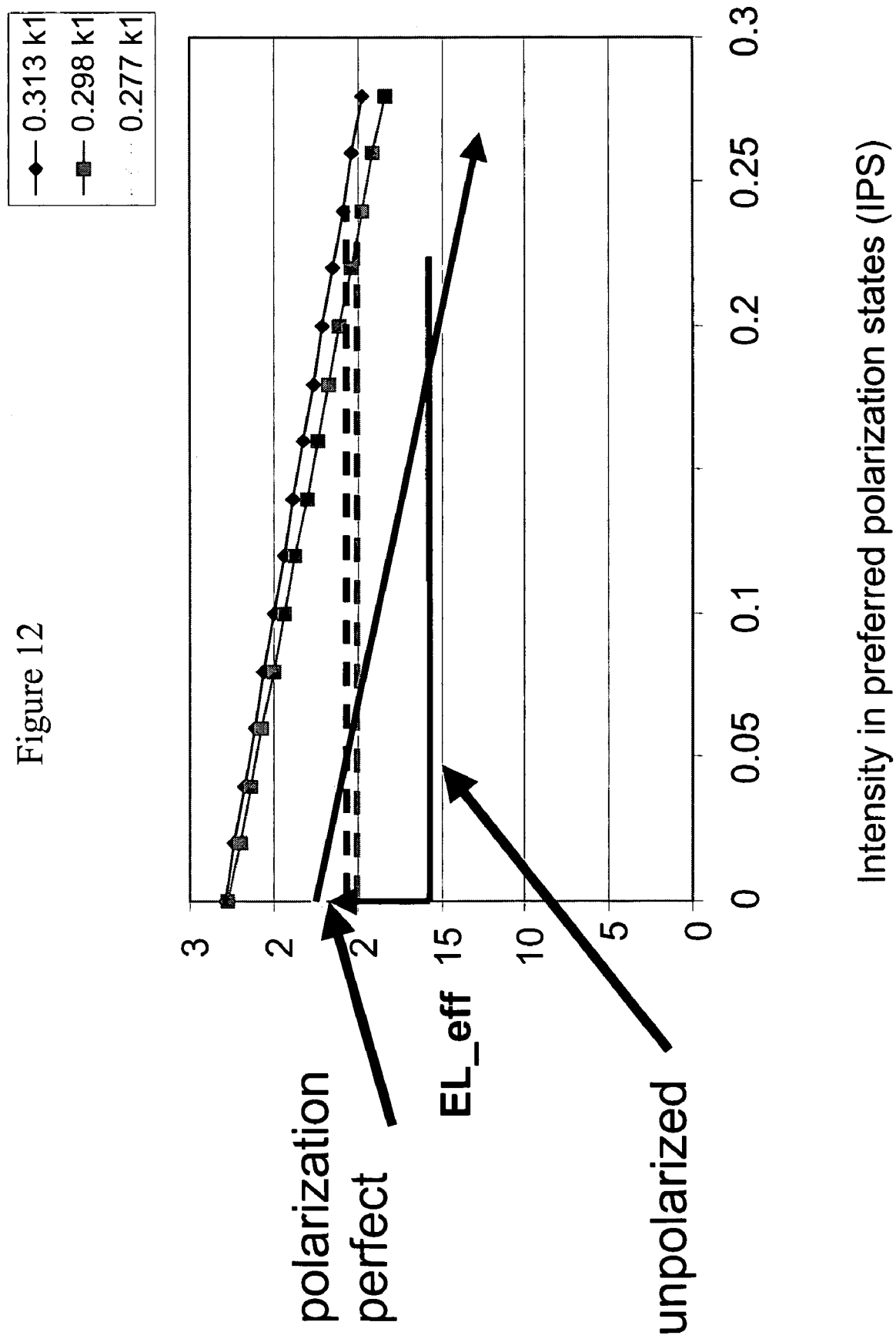
FIG. 12 depicts how a variation in IPS impacts exposure latitude (EL)

FIG. 12 depicts how a variation in IPS impacts the exposure latitude. For perfect polarization (IPS variation=O) there is a certain gain in EL by using polarization. When there is an IPS variation across the image field, then per field point a different absolute energy is needed to expose a feature. This leads to the fact that overlapping exposure windows of all field points is smaller than the maximum gain without variation.

Figure 13:
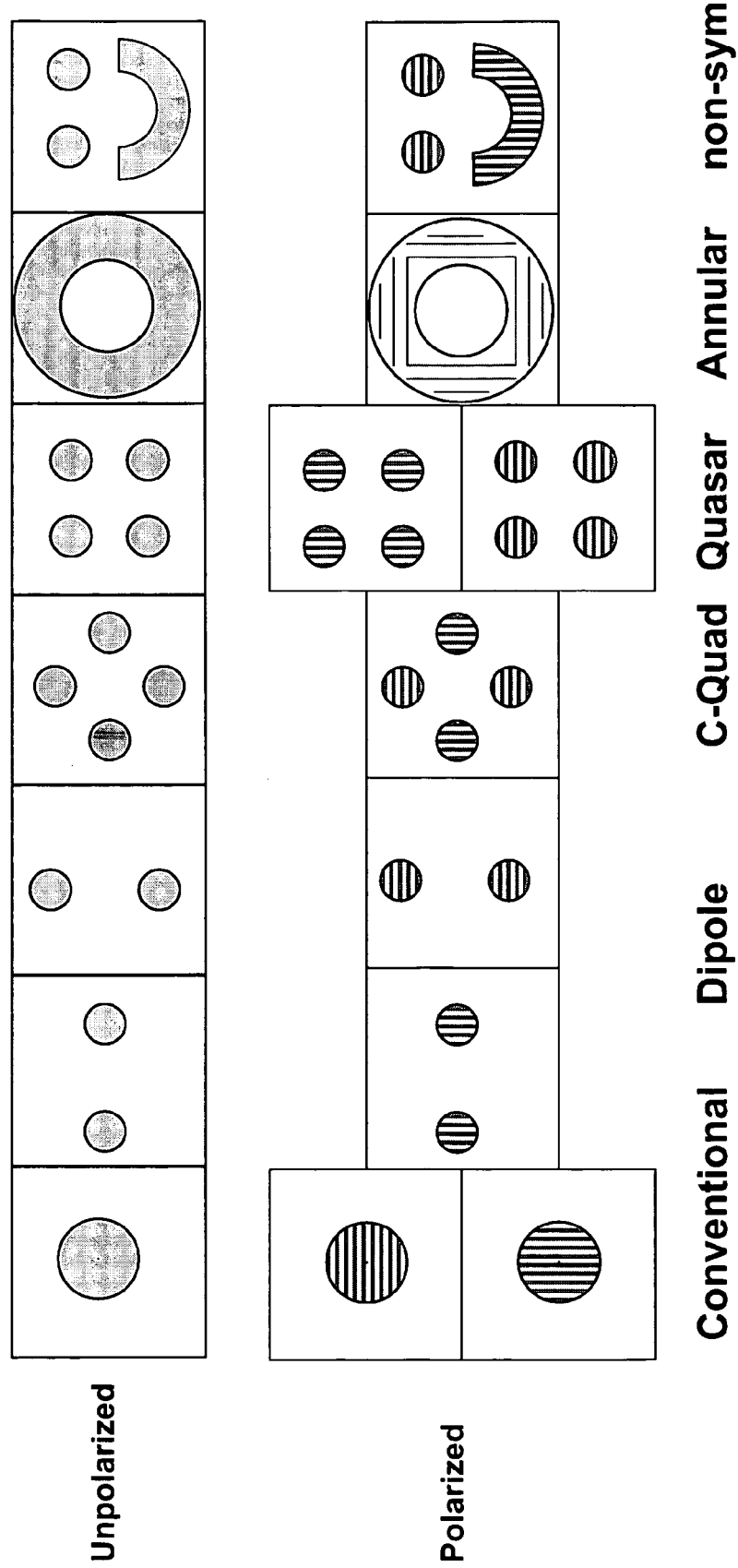
FIG. 13 depicts various illumination modes according to embodiments of the present invention.

FIG. 13 depicts different illumination modes according to the present invention such as conventional, dipole, quadrupole, annular and non-symmetric. As shown in FIG. 13 the quadrupole illumination has four segments oriented in a circular manner; such an arrangement is sometimes referred to as C-Quad. Furthermore, FIG. 13 shows an illumination mode known as Quasar (Trade name) which has four segments. Two different configurations for Quasar illumination are shown, one configuration is H polarized and the other is Y polarized.

Figure 14:
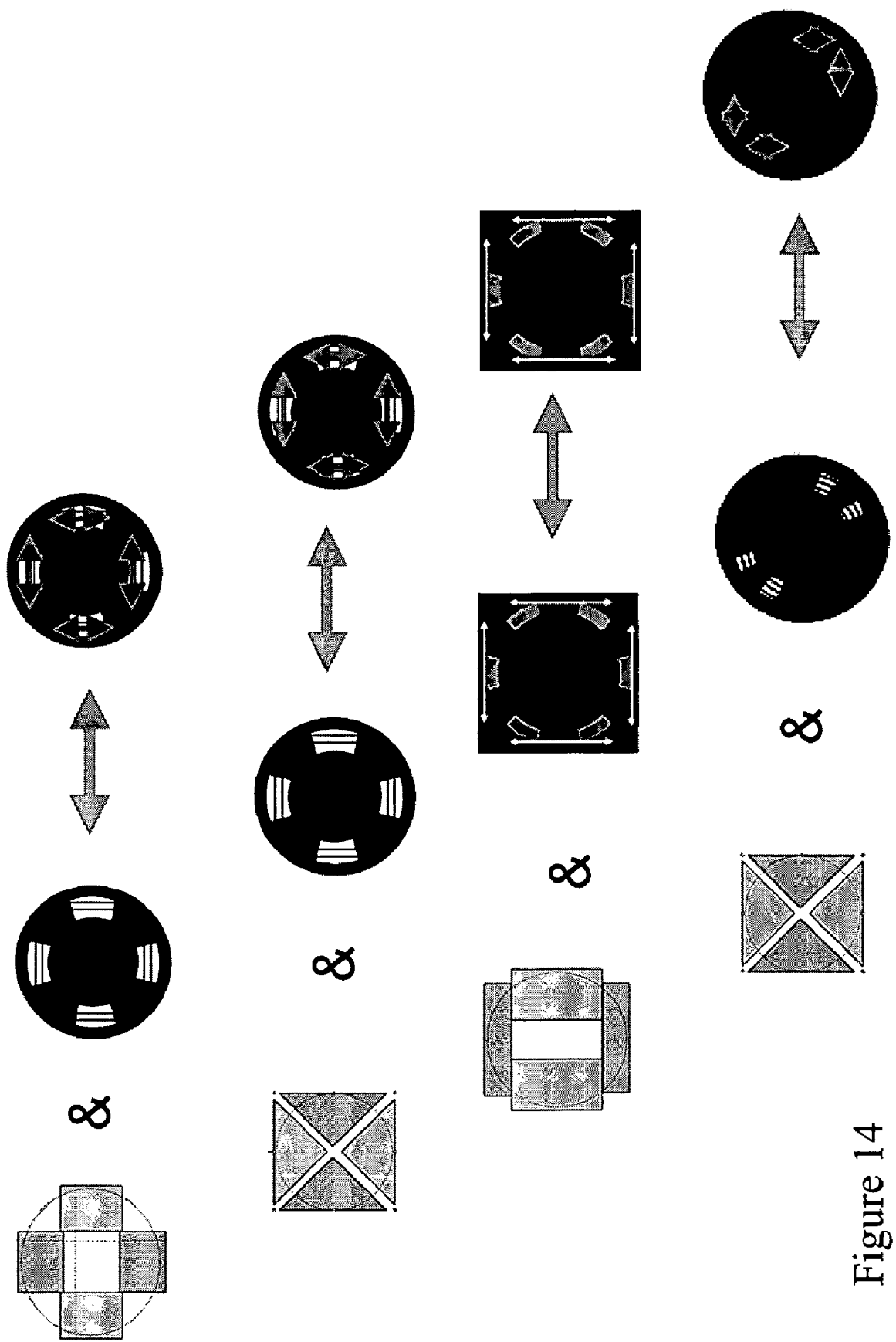
FIG. 14 depicts further illumination modes according to embodiments of the present invention.

FIG. 14 represents further possible illumination modes. C-Quad, Quasar (Trade Name), hexa-pole and a custom illumination mode are shown.

Figure 15:
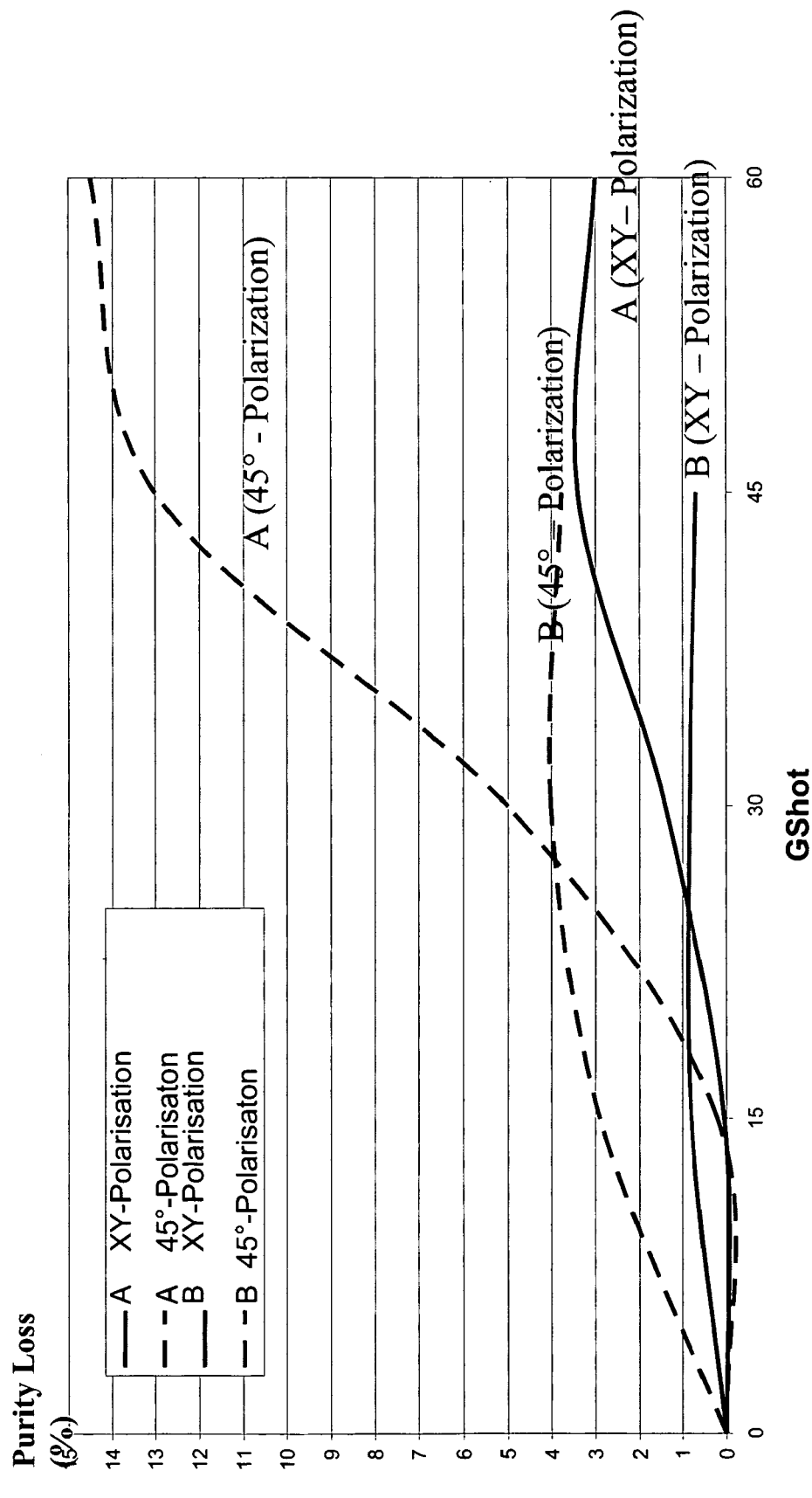
FIG. 15 depicts polarization lifetime effects for polarized radiation according to embodiments of the present invention and 45° polarized radiation.

FIG. 15 depicts polarization lifetime effects for illuminator materials A and B irradiated with XY polarization (i.e. the radiation is polarized in a first and second direction, said second direction being substantially perpendicular to the first) and 45° polarization. FIG. 15 clearly shows that using XY polarization that there is a significant reduction in the purity loss of the efficiency in the illuminator material i.e. the lifetime of the illumination system is increased. Two different silica types (A and B) are shown for the loss in polarization purity for 45° polarization which is the worst case. In comparison to using XY polarization, there is an improvement of a factor of 5 in the lifetime of the illumination system when using XY polarization. It is clear that when using 45° polarization that the illumination system has a lifetime of less than $20 \times 10^9$ shots (i.e. 20 G shots) and using XY polarization the illumination system has a lifetime of greater than about $35 \times 10^9$ shots (i.e. 35 G shots) and preferably greater than about $100 \times 10^9$ shots (i.e. 100 G shots). For example, material B in FIG. 15 shown to saturate at a very low induced birefringence level. It should be noted that the data shown in FIG. 15 are subject to change due to advances in material improvements, change of simulation conditions and thus are merely meant as educative and exemplary.

The desire to polarise light in the direction of the burnt-in birefringence or perpendicular thereto in order to extend the lifetime of the illuminating system is however at odds with the desire to illuminate a reticle with both linearly and circularly or unpolarized radiation (as described above). A compromise solution should be arrived at to at least partially satisfy these objective whilst at the same time providing an illuminating beam that contains both linear polarized radiation and unpolarized or circularly polarized radiation. The approach adopted here is to provide a radiation beam that is completely linearly polarized for transmission through certain of the upper components of the optical train, and to then convert a portion of that beam to circular polarization or unpolarized light prior to illumination of the patterning device.

Figure 16:
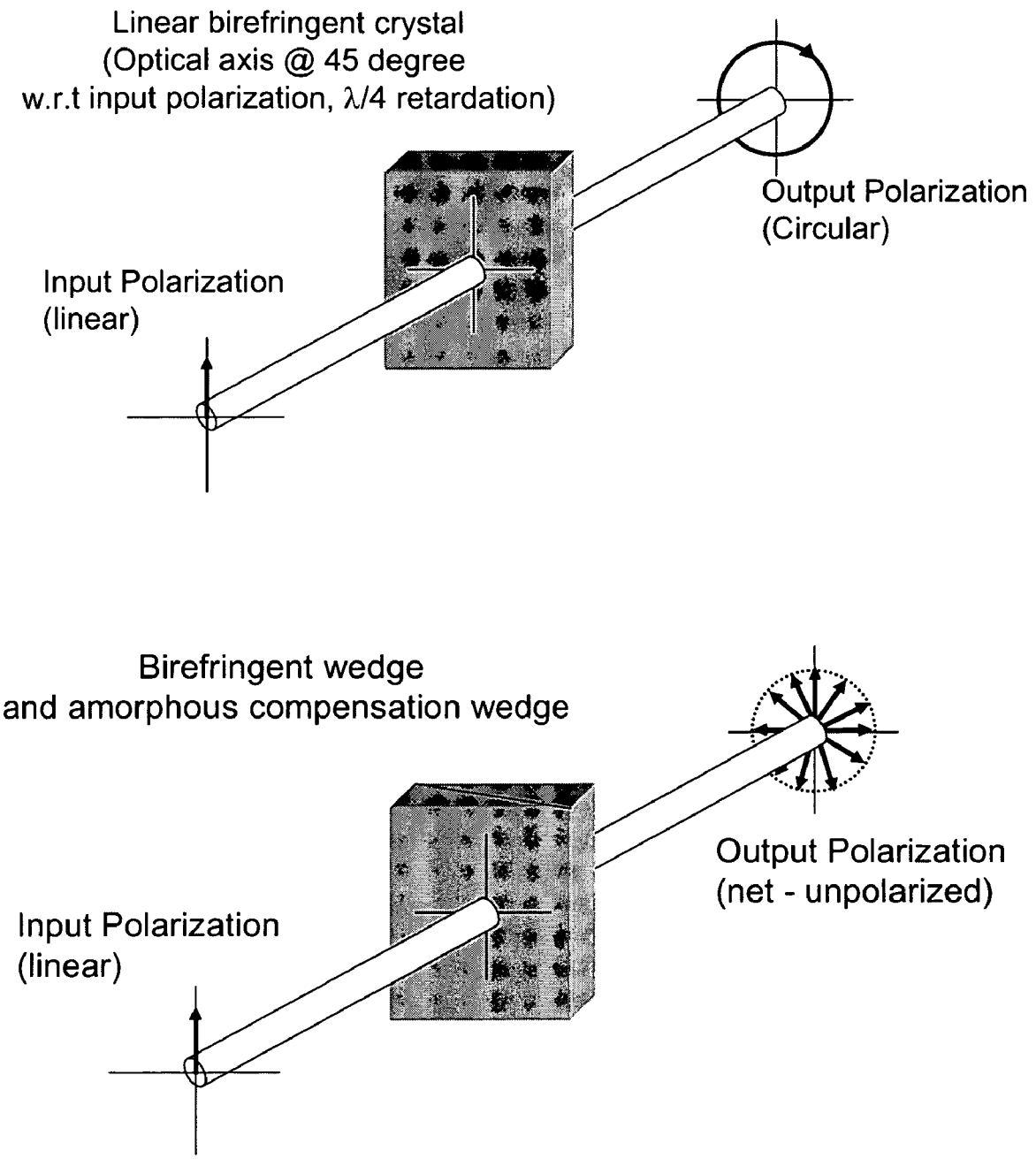
FIG. 16 illustrates an optical component suitable for performing linear to circular polarization conversion.

An optical component suitable for performing linear to circular polarization conversion and for performing linear to net-unpolarized conversion is illustrated in FIG. 16. The conversion to circular radiation is achieved with a quarter wave birefringent plate with is optical axis placed at less than 45 degrees to the incident polarization direction. The conversion to net-unpolarized radiation is achieved with a Hanle depolarizer that consists of two optically contacted wedges, one of which is birefringent and affects the polarization state differently at different locations. The depolarization arises from the local superposition of rotated polarizations. The second wedge compensates for the prismatic deviation. The depolarizer influences the polarization of radiation so that the average degree of polarization is zero.

Figure 17:
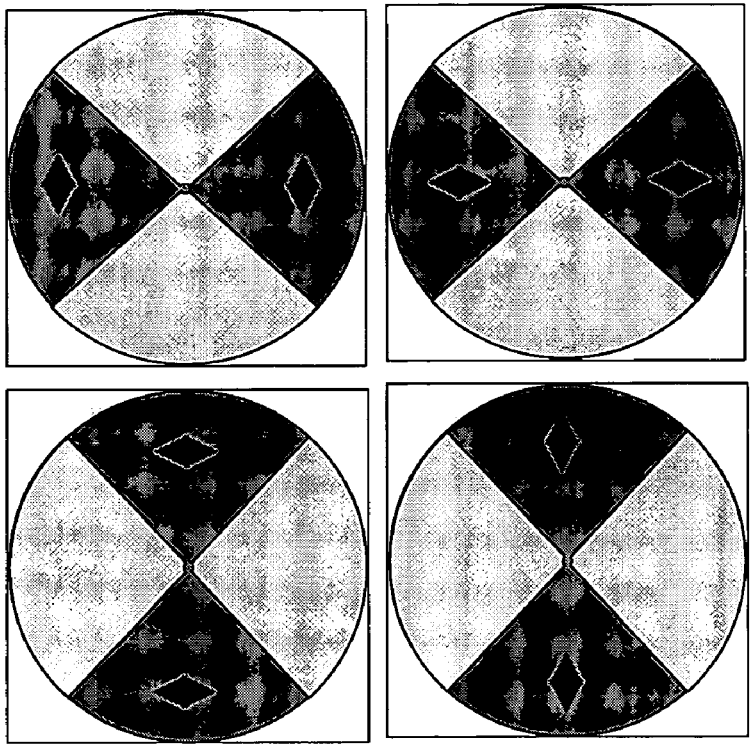
FIG. 17 illustrates several conventional illumination modes with segmented linearly polarized and unpolarized or circularly polarized portions.

FIG. 17 illustrates several conventional illumination modes with segmented linearly polarized and unpolarized or circularly polarized portions, where the latter may comprise components of the type illustrated in FIG. 16. These polarized illumination modes are potentially relevant for Manhattan type X and Y oriented structures with dissimilar pitches in both directions.

Figure 18:
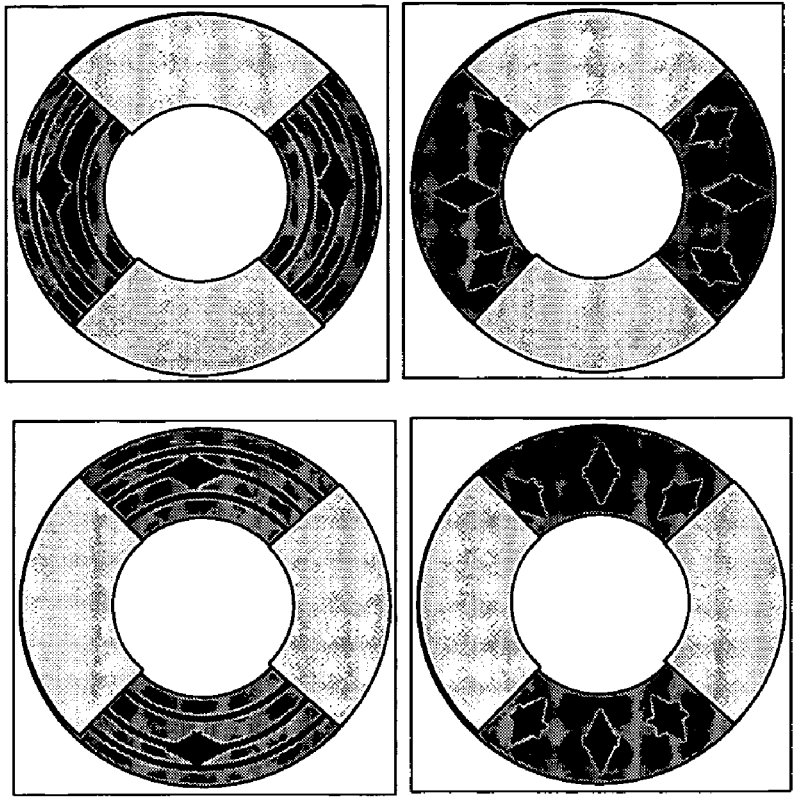
FIG. 18 illustrates several annular illumination modes with segmented polarized (tangential (TE) or radial (TM)) and unpolarized or circularly polarized portions.

FIG. 18 illustrates several annular illumination modes with segmented polarized (tangential (TE) or radial (TM)) and unpolarized or circularly polarized portions. These polarized illumination modes are potentially relevant for Manhattan type X and Y oriented structures with dissimilar pitches in both directions.

Figure 19:
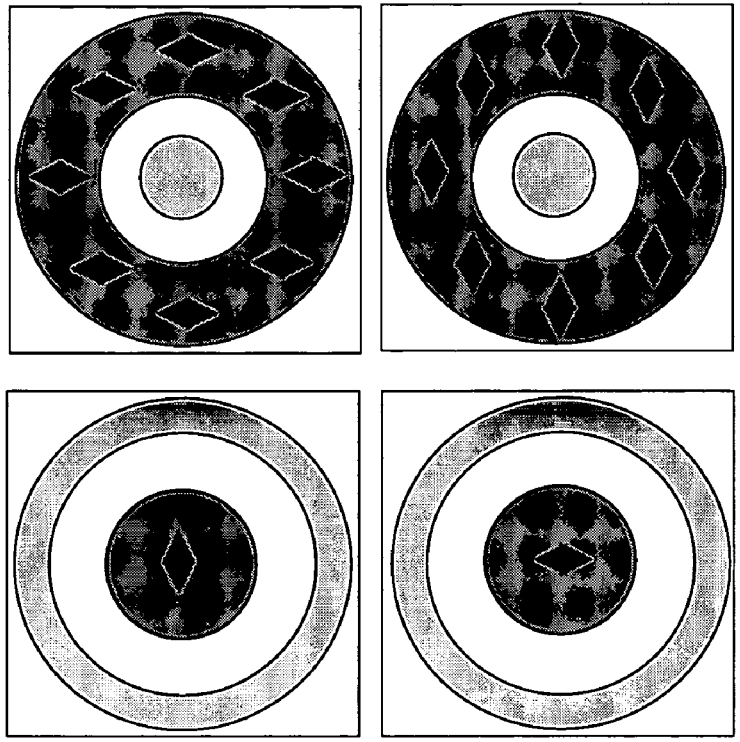
FIG. 19 illustrates several mixed conventional and annular illumination modes with linearly polarized and unpolarized or circularly polarized portions.

FIG. 19 illustrates several mixed conventional and annular illumination modes with linearly polarized and unpolarized or circularly polarized portions. These polarized illumination modes are potentially relevant for Manhattan type X and Y oriented structures with dissimilar pitches in both directions. These polarized illumination modes are also potentially relevant for contact layers with dissimilar pitches in several directions.

Figure 20:
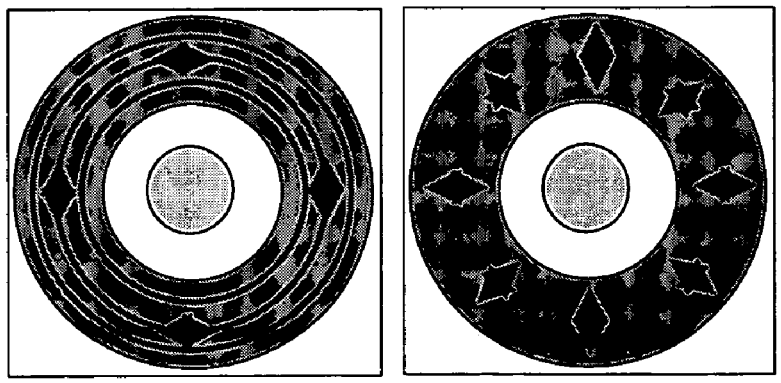
FIG. 20 illustrates several mixed conventional and annular illumination modes with tangential (TE) or radial (TM) polarized and unpolarized or circularly polarized portions.
Figure 20:
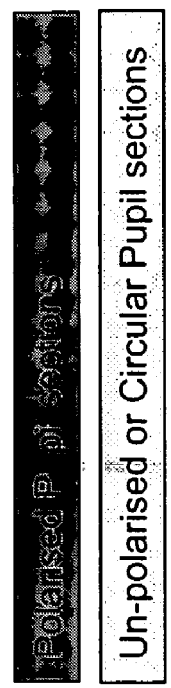

FIG. 20 illustrates several mixed conventional and annular illumination modes with tangential (TE) or radial (TM) polarized and unpolarized or circularly polarized portions. These polarized illumination modes are potentially relevant for contact layers with dissimilar pitches in several directions.

Figure 21:
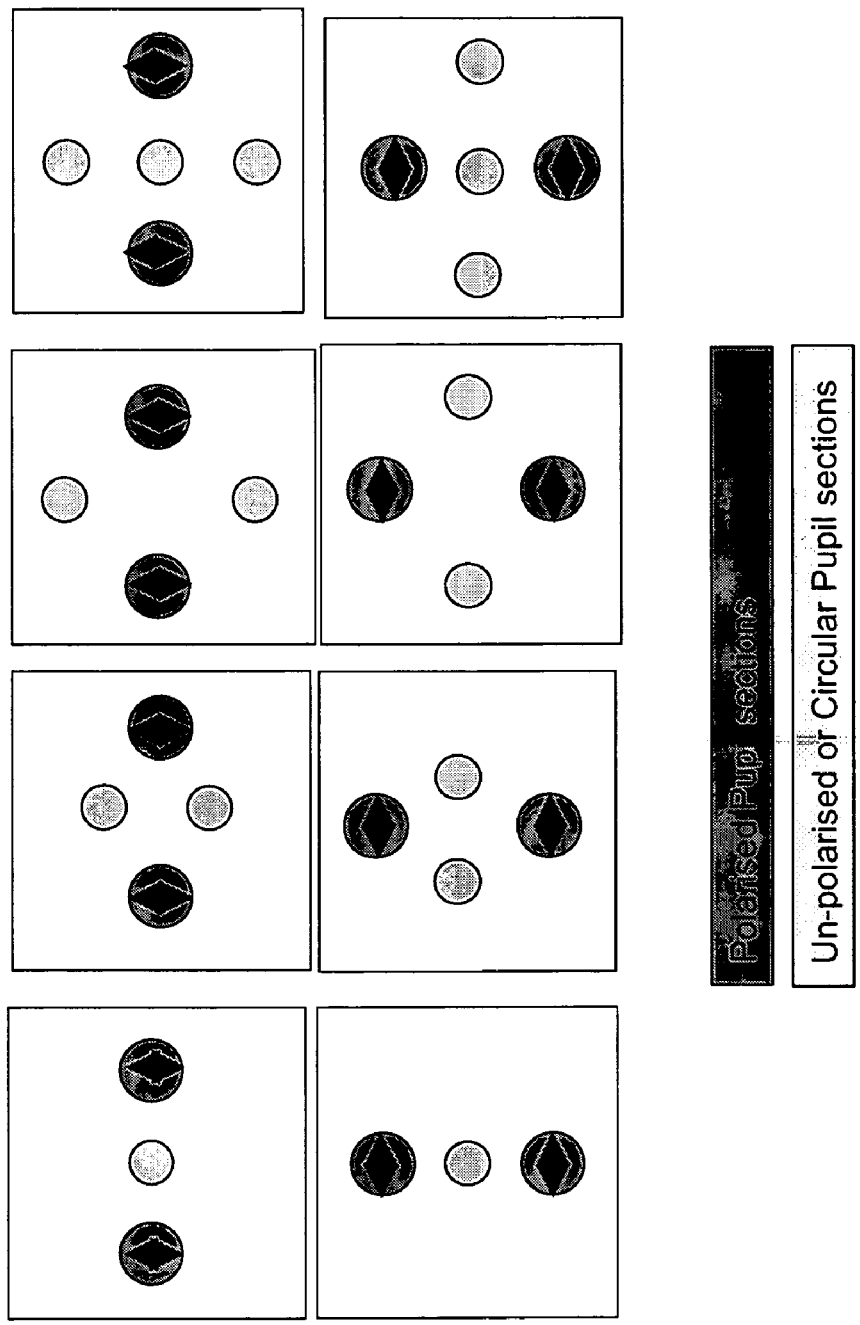
FIG. 21 illustrates several symmetric multi-pole illumination modes with linearly polarized and unpolarized or circularly polarized portions.

FIG. 21 illustrates several symmetric multi-pole illumination modes with linearly polarized and unpolarized or circularly polarized portions. These polarized illumination modes are potentially relevant for unidirectional dense features and are optimized for end-of-line or end-of-array ringing effects.

Figure 22:
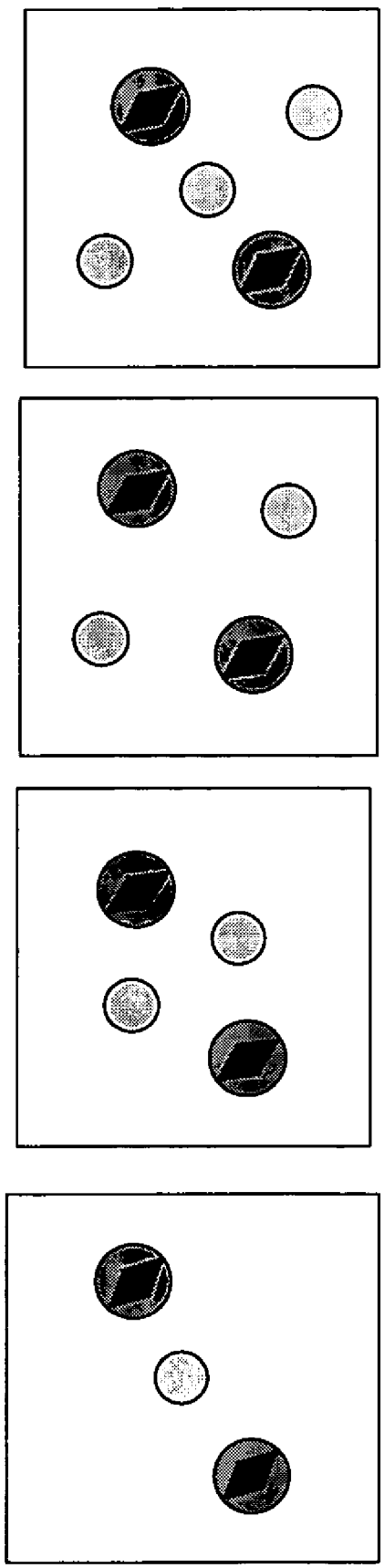
FIG. 22 illustrates several rotated multi-pole illumination modes with linearly polarized and unpolarized or circularly polarized portions.

FIG. 22 illustrates several rotated multi-pole illumination modes with linearly polarized and unpolarized or circularly polarized portions. These polarized illumination modes are potentially relevant for rotated unidirectional dense features and are optimized for end-of-line or end-of-array ringing effects.

Figure 23:
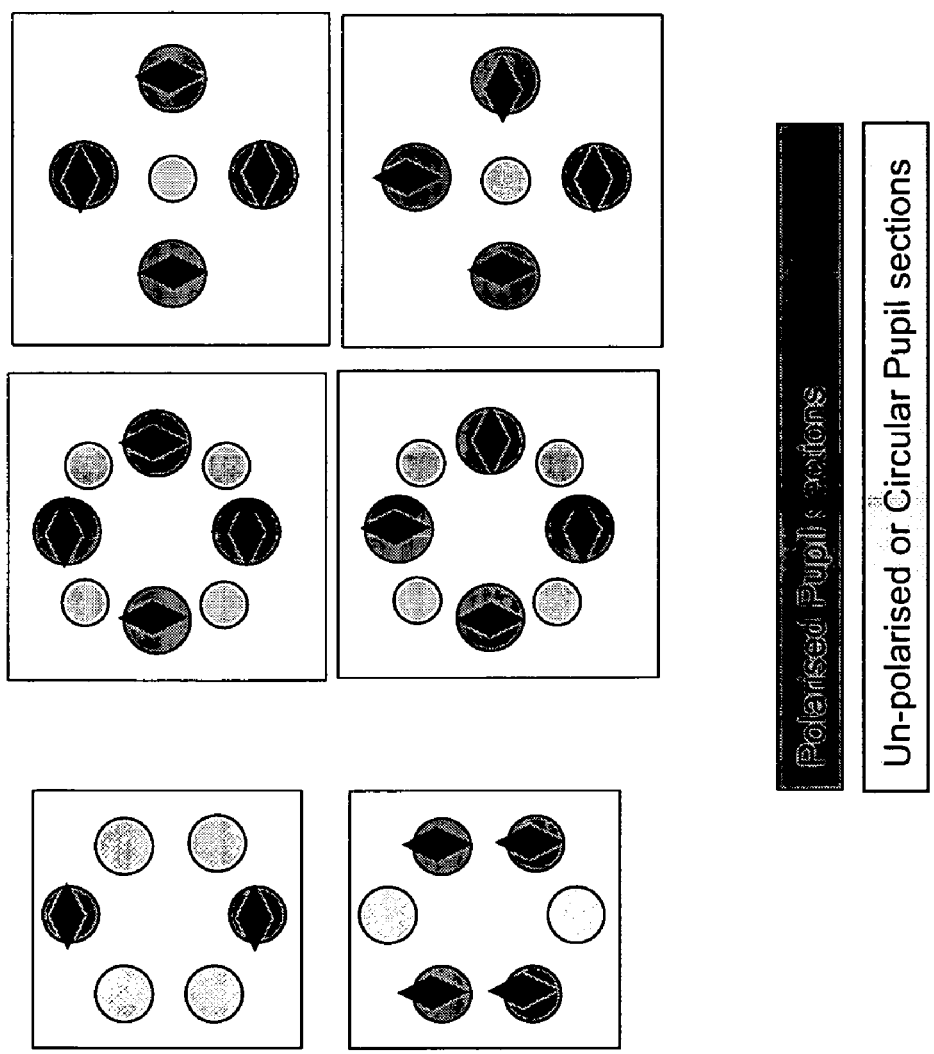
FIG. 23 illustrates several multi-pole illumination modes with linearly polarized and unpolarized or circularly polarized portions.

FIG. 23 illustrates several multi-pole illumination modes with linearly polarized and unpolarized or circularly polarized portions. The left polarized illumination modes are potentially relevant for 2D dense features and are optimized for end-of-line or end-of-array ringing effects. The right four polarized illumination modes are potentially relevant for Manhattan type X and Y oriented structures with dissimilar pitches in both directions.

FIG. 24 illustrates several soft-quasar illumination modes with linearly or tangential (TE) or radial (TM) polarized portions and unpolarized or circularly polarized portions. These polarized illumination modes are potentially relevant for contact layers with dissimilar pitches in several directions.

FIG. 25 illustrates the resulting polarization of the radiation beam following transmission through a wedged Hanle depolarizer (left panel) and a λ/4 plate (right panel), both illuminated by a linearly polarized radiation beam. The Hanle depolarizer comprises two wedges of dissimilar materials. A first of the wedges comprises an optically active material, e.g. crystalline quartz, whilst the second comprises an optically inactive material, e.g. fused silica. In another alternative approach, the conversion from linearly polarized radiation to unpolarized radiation may be achieved using a diffractive optical element (DOE) built up from multiple components each providing a different polarization.

The converting optical component should be located at or close to a pupil plane of the illuminating system. With reference to FIGS. 3a, 3b, and 3c, this component may replace the half-wavelength plate illustrated in those Figures, where only X polarization of the linearly polarized portion of the beam is used. If both X and Y polarization are used, the half-wavelength plate may be retained, with the circularly polarizing component (or component that provides unpolarized radiation) being located directly below the half-wavelength plate. It is also possible to provide a single optical component that is able to introduce both the Y linear polarization and the circular polarization (or produce unpolarized radiation). A preferred location for the converting optical component is at the interface of the adjustor and the integrator.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (UV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus comprising:
   an illumination system having optical elements configured to condition a radiation beam to comprise in cross-section a first portion of unpolarized or circularly polarized radiation and a second portion of a different polarization;
   a support configured to support a patterning device, the patterning device configured to impart that radiation beam from the illumination system with a pattern in its cross-section to form a patterned radiation beam;
   a substrate table configured to hold a substrate; and
   a projection system configured to project the patterned radiation beam onto a target portion of the substrate.

2. The apparatus according to claim 1, wherein said second portion of the radiation beam is linearly polarised.

3. The apparatus according to claim 1, wherein said second portion of the radiation beam comprises tangentially (TE) or radially (TM) polarized radiation.

4. The apparatus according to claim 1, the optical elements arranged to produce circularly polarized or unpolarized radiation within a central portion of the radiation beam, and linearly polarized radiation within an outer portion of the radiation beam.

5. The apparatus according to claim 1, wherein said first and second portions each comprise one or more segments of the beam cross-section.

6. The apparatus according to claim 1, wherein said first and second portions each comprise one or more annular rings of the beam cross-section.

7. The apparatus according to claim 1, wherein said first portion is an inner circular portion, and said second portion is a ring around the first portion.

8. The apparatus according to claim 1, wherein said optical elements comprise an optical element located substantially at a pupil plane of the illumination system to produce said circularly polarized or unpolarized radiation.

9. The apparatus according to claim 1, wherein an optical element configured to produce said circularly polarized or unpolarized radiation is located in one of a condensor (CO), adjustor (AD) or integrator (IN).

10. The apparatus according to claim 1, wherein said optical elements comprise a $\lambda/4$ plate to produce circular polarization; a pair of adjacent wedges of different material, a first of the wedges formed of an optically active material, and the second formed of an optically inactive material, arranged to transform a portion of the radiation beam into unpolarized radiation; or a diffractive optical element comprising multiple portions each creating a different polarization.

11. The apparatus according to claim 1, comprising an optical element configured to produce circularly polarized or unpolarized radiation and a further optical element configured to provide linear polarization of said second portion of the radiation beam.

12. The apparatus according to claim 11, wherein said further optical component is a λ/2 plate.

13. The apparatus according to claim 1, comprising a numerical aperture (NA) greater than about 1.0.

14. The apparatus according to claim 1, wherein at least part of the lithographic apparatus may be immersed in an immersion fluid such as water.

15. A lithographic apparatus comprising:
an illumination system comprising a first optical element configured to condition a radiation beam so as to comprise substantially only linearly polarized radiation polarized in a first direction and/or linearly polarized radiation polarized in a second direction perpendicular to said first direction, one or more second optical elements subject to developing birefringence having an optical axis in said first direction and through which the linearly polarized radiation is transmitted, and a third optical element configured to, subsequent to the radiation being transmitted by the one or more second optical elements, transform at least a part of the linearly polarized radiation into unpolarized or circularly polarized radiation;
a support configured to support a patterning device, the patterning device configured to impart the radiation beam from the illumination system with a pattern in its cross-section to form a patterned radiation beam;
a substrate table configured to hold a substrate; and
a projection system configured to project the patterned radiation beam onto a target portion of the substrate.

16. The apparatus according to claim 15, wherein said third optical element is located substantially at a pupil plane of the illumination system.

17. The apparatus according to claim 15, wherein the third optical element is configured to transform only a central portion of the radiation beam into unpolarized or circularly polarized radiation, leaving an outer ring of linearly polarized radiation.

18. The apparatus according to claim 15, wherein the third optical element is a λ/4 plate configured to transform a part of the radiation beam into circularly polarized radiation.

19. The apparatus according to claim 15, wherein the third optical element comprises a pair of adjacent wedges of material, a first of the wedges formed of an optically active material, and the second formed of an optically inactive material, configured to transform a portion of the radiation beam into unpolarized radiation.

20. The apparatus according to claim 15, wherein the first optical element comprises a set of optically active plates or birefringent plates.

21. The apparatus according to claim 20, wherein the optically active plates or birefringent plates are half-wavelength plates located in any of the condensor (CO), adjustor (AD) or integrator (IN).

22. The apparatus according to claim 20, wherein the optically active plates or birefringent plates are half-wavelength plates located in or near a pupil plane.

23. A device manufacturing method comprising:
providing a substrate;
providing a conditioned radiation beam using an illumination system, wherein providing the conditioned radiation beam comprises conditioning a radiation beam to comprise in cross-section a first portion of unpolarized or circularly polarized radiation and a second portion of a different polarization;
imparting a pattern, using a patterning device, the conditioned radiation beam from the illumination system to form a patterned beam of radiation; and
projecting the patterned beam of radiation onto a target portion of the substrate.

24. A device manufacturing method comprising:
providing a substrate;
providing a conditioned radiation beam using an illumination system;
imparting a pattern to the radiation; and
projecting the patterned beam of radiation onto a target portion of the substrate;
wherein providing the conditioned radiation beam comprises conditioning a radiation beam so as to comprise substantially only linearly polarized radiation polarized in a first direction and/or linearly polarized radiation polarized in a second direction perpendicular to said first direction, transmitting the radiation through an optical element subject to developing birefringence having an optical axis in said first direction, and subsequent to the radiation being transmitted by optical element subject to developing birefringence, transforming at least a part of the linearly polarized radiation into unpolarized or circularly polarized radiation.

* * * * *